Aug. 11, 1959 T. SLONCZEWSKI 2,899,643

OSCILLATOR AUTOMATIC TUNING CIRCUIT

Filed Aug. 1, 1957 2 Sheets-Sheet 1

INVENTOR
T. SLONCZEWSKI
BY

ATTORNEY

INVENTOR
T. SLONCZEWSKI
BY [signature]
ATTORNEY

Patented Aug. 11, 1959

2,899,643

OSCILLATOR AUTOMATIC TUNING CIRCUIT

Thaddeus Slonczewski, Summit, N.J., assignor to Bell Telephone Laboratories, Incorporated, New York, N.Y., a corporation of New York Application August 1, 1957, Serial No. 675,642

10 Claims. (Cl. 331—17)

This invention relates to an automatic tuning system for oscillatory circuits, and more specifically to such a system utilizing an improved frequency discriminator arrangement whereby the tuning of the oscillatory circuit to a predetermined frequency can be maintained with a high degree of accuracy.

Many automatic tuning systems for oscillatory circuits are known wherein frequency deviations from a predetermined frequency are detected, and the detector signal is employed to control circuits for supplying a driving signal to an electric motor for actuating a variable capacitor to retune the oscillatory circuit. In one typical prior art automatic tuning system, the oscillatory circuit output is applied to a discriminator circuit comprising a pair of stagger-tuned resonant circuits, a pair of triode detector circuits, and a pair of triode load circuits each including a relay. The stagger-tuned circuits have equal impedance at the desired oscillatory circuit frequency and the relays control the power supply connections for separate windings on the tuning motor. The discriminator circuit includes two parallel signal transmission paths, and each path includes one of the stagger-tuned resonant circuits, a triode detector, and a load circuit, including one of the relays. A change in the oscillatory circuit frequency unbalances the potentials across the stagger-tuned circuits and thus causes a greater voltage to be applied via the triode detectors to one relay than to the other. If the original frequency deviation is sufficinetly large, one relay will be actuated to cause the corresponding winding of the tuning motor to be energized and to cause the oscillator to be retuned.

Certain problems encountered in the operation of the prior art oscillatory circuit tuning arrangement render its unsuitable for use in oscillatory circuit tuning systems wherein a high degree of accuracy must be maintained such, for example, as in determining the transmission characteristics of submarine cables during manufacture. One problem concerns the accuracy of the tuning system which is dependent upon the maintenance of symmetrical characteristics between the two parallel signal transmission paths constituting the frequency discriminator circuit. An increase in oscillatory circuit frequency should produce the same response in the parallel path which includes the resonant circuit tuned above the center frequency as a decrease in oscillatory circuit frequency produces in the other parallel path which includes the resonant circuit tuned below the center frequency. This is an almost impossible task where there is a separate detector, either a triode or a diode, in each parallel path for the reasons that the detector characteristics vary considerably from one triode or diode to another within permissible manufacturing tolerances and change differently with aging. As a consequence, the discriminator circuit balance must be checked at frequent intervals. Another problem involves the fact that a certain minimum change in applied energy is required to actuate the relays which control the application of power to the windings of the tuning motor. Thus, it is apparent that oscillatory circuit frequency can vary freely within a certain band without the discriminator output becoming sufficiently large to initiate any automatic control action.

Accordingly, it is a principal object of this invention to control automatically the frequency of an oscillatory circuit with an accuracy not heretofore attainable.

It is another object to reduce the length of parallel signal transmission paths which are required in oscillatory circuit automatic tuning systems.

Another object is to detect and utilize frequency deviations in the output of an oscillatory circuit in a unique manner automatically to reduce the extent of such deviations.

These and other objects of this invention are attained in an illustrative embodiment thereof wherein the oscillatory circuit output is sampled at a rate which is substantially less than the oscillatory circuit output frequency. The samples are formed into an alternating potential wave having an amplitude which is indicative of the amount of the frequency deviation from a predetermined frequency and having a polarity which is indicative of the sense of the deviation. The operating windings of a tuning motor are energized by such alternating potential wave to actuate the tuning means in the oscillatory circuit.

The oscillatory circuit output wave is applied to a frequency-sensitive network comprising a high-pass filter and a low-pass filter having the inputs thereof connected in multiple to the oscillatory circuit output and having attenuation characteristics which are equal at only one predetermined frequency, that is, the desired output frequency of the oscillatory circuit. The output of each of these filters is sampled at a sixty cycle per second rate by a sampling relay. The samples of the output of either filter taken alone include information in the amplitude thereof which can indicate the amount of an oscillatory circuit frequency deviation from the predetermined frequency. In order to extract this information, the series of samples from the output of one of the filters is compared with another series of samples from the output of the other of the filters by interleaving the two series of samples. The interleaving is accomplished by the sampling relay which may be a single-pole-double-throw type of relay that alternately applies the respective samples from the two filters to a single conductor. Now, in addition to the information concerning the amount of the frequency deviation which is contained in the amplitude of either series of samples, the polarity of the difference in amplitudes of the two series of samples contains information concerning the sense of the frequency deviation.

The interleaved samples from the relay are applied to a rectifier having a single current conduction path. The envelope of the rectified samples, a substantially rectangular wave, is extracted by a low-pass filter connected to the rectifier output, and the alternating current component of the envelope is applied to one winding of a two-phase induction motor which is mechanically coupled to the tuning means in the oscillatory circuit. Another winding of the induction motor is energized by the same alternating potential source which actuates the sampling relay. Since the high-pass and low-pass filter outputs are always sampled during the same portions, respectively, of the alternating potential source cycle, the direction and amount of rotation of the motor in response to the application thereto of the rectangular wave are functions of the direction and amount, respectively, of the frequency deviation.

When the oscillatory circuit frequency increases to a value greater than the one frequency at which the discriminator filter outputs are equal, the output of the high-pass filter is greater than the output of the low-pass filter; and the rectified sample envelope has a first-phase relationship, for example 90 degrees leading, with respect to the alternating potential source wave. This envelope therefore causes the induction motor to turn in one direction to decrease the oscillatory circuit frequency. If the oscillatory circuit frequency decreases to a value below the one frequency at which the discriminator filter outputs are equal, the rectified sample envelope is 180 degrees out of phase with the envelope wave in the previous instance and therefore lags by 90 degrees the alternating potential source wave. Accordingly, the induction motor is now caused to rotate in the opposite direction to increase the oscillatory circuit frequency.

It is one feature of the invention that only the frequency-sensitive impedance network comprising the discriminator filters includes parallel transmission paths. The detector and the motor winding to which the frequency-sensitive impedance network outputs are applied are the same whether the oscillatory circuit output frequency is greater or less than the desired frequency. Accordingly, the problem of balancing parallel transmission paths is substantially reduced.

It is another feature that all frequency deviations, no matter how small, are converted into an alternating wave envelope of a corresponding magnitude for energizing the induction motor to retune the oscillator. This feature makes it possible to attain greater precision in oscillator tuning than has been heretofore possible by using relays which are only responsive to oscillatory circuit mistuning of a fixed or minimum amount.

Still another feature of the invention concerns the sample envelope wave which includes information indicating both the sense and amount of mistuning so that the motor energization is reduced as the amount of mistuning is reduced thereby reducing the tendency for the tuning system to hunt.

A complete understanding of the invention may be obtained upon a consideration of the following specification in connection with the attached drawing in which.

Figure 1:
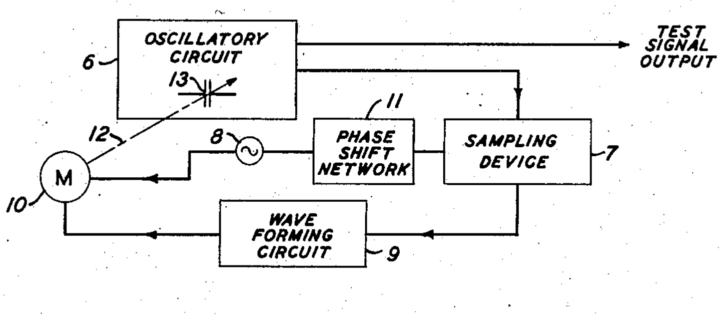
Fig. 1 is a block and single line diagram illustrating the general concept of an oscillatory circuit tuning system in accordance with the invention.

Referring to Fig. 1, an oscillatory circuit 6 is provided with connections for deriving therefrom a test signal output and an output for a servo feedback circuit for automatically adjusting the tuning of oscillatory circuit 6 in response to any deviation in the output frequency thereof from a predetermined frequency. The test signal output and the output to the feedback circuit may be at the same frequency or they may be at substantially different frequencies as hereinafter discussed in connection with Fig. 3. The feedback circuit includes a sampling device 7 actuated by one portion of alternating potential supplied from source 8 via a phase shift network 11 for deriving from the output of oscillatory circuit 6 a series of energy pulses, or samples, occurring at a frequency which is much less than the frequency of the oscillatory circuit output for the feedback circuit. The samples thus derived are applied to a wave-forming circuit 9 wherein they are utilized to form an alternating energy control wave which is then applied to one input connection of two-phase induction electric motor 10. The input to the second input connection of motor 10 will be presently mentioned. The sampling and wave-forming functions of device 7 and circuit 9 are not, however, entirely independent of one another as will be hereinafter described in connection with the practical embodiments of the invention.

The alternating energy control wave is characterized in that its amplitude is a function of the magnitude of any mistuning or deviation of the frequency of the output of oscillatory circuit 6 from a predetermined frequency; and the phase, or polarity, thereof is a function of the direction of such mistuning or frequency deviation with respect to the predetermined frequency. A second portion of the output of source 8 is also applied to the second input connection on motor 10 and the reaction of the two alternating waves within motor 10 causes rotation of the armature thereof which is coupled to oscillatory circuit 6 by a suitable mechanical coupling which is schematically represented by the broken line 12. An appropriate tuning means schematically represented as the variable capacitor 13 within oscillatory circuit 6 is arranged to be adjusted by the mechanical coupling 12 for changing the frequencies of both the test signal output and the output to the servo feedback path.

Figure 2:
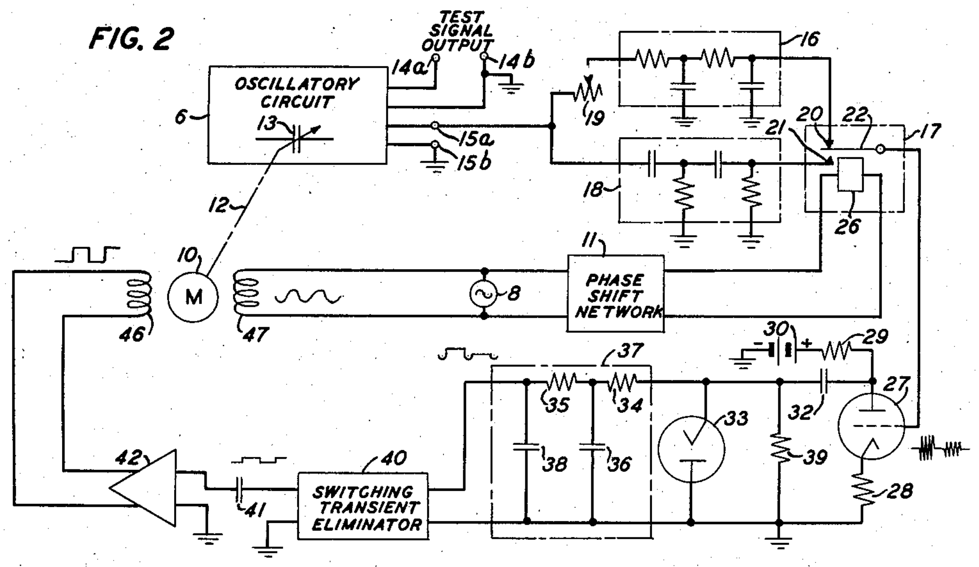
Fig. 2 is a schematic diagram of a specific embodiment of the invention.

Referring to Fig. 2, the test signal output of oscillatory circuit 6 appears at the terminals **14*a* and 14*b* thereof. Oscillatory circuit 6 also provides another output which is utilized in the automatic frequency control feedback circuit outlined above in connection with Fig. 1. The latter output appears at terminals 15*a* and 15*b* of oscillatory circuit 6. A discriminator circuit comprising a low-pass filter 16 and a high-pass filter 18 having the inputs thereof connected in multiple to the terminals 15*a* and 15*b* detects deviations in the output frequency of oscillatory circuit 6. Filters 16 and 18 are illustrated as conventional resistance-capacitance filters but the use of this particular type of filter is not essential to the invention. The shunt branches of filters 16 and 18, as well as the terminals 14*b* and 15*b*, are connected to ground. Filters 16 and 18 are designed so that the voltage output versus frequency characteristics thereof cross one another at a predetermined frequency $f$ which corresponds to the predetermined output frequency of oscillatory circuit 6 at terminals 15*a* and 15*b*. In other words, the attenuations of filters 16 and 18** are equal at the frequency $f$ only.

A rheostat 19 connected in series in the input to filter 16 may be so adjusted that the voltage versus frequency characteristic of that filter may be adjusted upwardly or downwardly. Such adjustment of the output voltage versus frequency characteristic of filter 16 causes the cross-over frequency of the characteristics of filters 16 and 18 to vary, and it further causes the output frequency of oscillatory circuit 6 at terminals **15*a* and 15*b*** to be varied as will become evident with the subsequent description of the circuit of Fig. 2.

A sampling relay 17 is provided with a pair of fixed contacts 20 and 21, an armature 22, and an operating coil 26 which is connected via a phase shift network 11 to the terminals of alternating potential source 8 to be energized thereby. One output terminal of low-pass filter 16 is connected to contact 20 and one output terminal of high-pass filter 18 is connected to contact 21.

Relay 17 may be of a type which would normally pick up and drop out at a relatively low voltage during each half cycle of the output voltage from source 8. However, phase shift network 11 is designed to shift the phase of the voltage applied to the operating coil 26 in such amount that armature 22 is caused to transfer between contacts 20 and 21 approximately at the same time as the occurrence of the peak of each half cycle of the output voltage from source 8. This arrangement causes the alternating energy wave which is subsequently formed from the filter output samples to be always approximately 90 degrees out of phase with the output wave of source 8.

It will be observed that discriminator filters 16 and 18 and sampling relay 17 cooperate to provide the two series of samples of the output at terminals **15*a* and 15*b*** as described above in connection with the sampling device 7 of Fig. 1. However, as will be hereinafter discussed, the differential attenuation of filters 16 and 18 of Fig. 2 also provides the control wave magnitude function attributed to the wave-forming circuit 9 of Fig. 1.

The output of sampling relay 17 appears at armature 22 and comprises a first series of oscillation samples of the output of low-pass filter 16 and a second series of oscillation samples of the output of high-pass filter 18. The individual samples in the two series of oscillation samples are interleaved with one another, and the interleaved samples are separated by relatively short zero signal intervals which represent the time during which armature 22 is in transit between contacts 20 and 21. The samples of the two series are of equal amplitude if the output frequency of oscillatory circuit 6 at terminals 15*a* and 15*b* is equal to the predetermined frequency *f*; the samples in the series from the output of low-pass filter 16 are of greater amplitude than those from high-pass filter 18 if the output frequency of oscillatory circuit 6 is less than the predeterminded frequency *f*; and the samples in the series from the output of high-pass filter 18 are of greater amplitude than those derived from low-pass filter 16 when the output frequency of oscillatory circuit 6 is greater than the predetermined frequency *f*.

The spaced samples of both series are applied to the control grid of a buffer amplifier triode 27. This triode is provided with a self-biasing resistor 28 connected between ground and its cathode and is further provided with a load resistor 29 and a battery 30 connected in series between ground and its anode. A rectifier having a single current conduction path and comprising the vacuum tube diode 33 is connected between ground and the anode of triode 27 via coupling capacitor 32. The anode of diode 33 is connected to ground so that the negative-going portions of the samples which are amplified by buffer amplifier triode 27 are shunted to ground. The input of a low-pass filter 37 comprising the series resistors 34 and 35 and the shunt capacitors 36 and 38 is connected across diode 33. A shunt resistor 39 is also connected across diode 33 to provide a leakage path to ground and thereby prevent an excessive accumulation of charge on shunt capacitors 36 and 38 during the positive half-cycles of the amplified samples. The diode 33 and the filter 37 function as an envelope detector to extract the envelope of the interleaved samples, which envelope appears in the output of filter 37 as a series of spaced positive-going pulses.

The output of filter 37 is connected to the input of a switching transient eliminator circuit 40 which eliminates the spaces between the positive-going pulses, thereby producing an alternating rectangular energy wave that will be described herein after in connection with Fig. 4. The alternating current component of the output of transient eliminator circuit 40 is coupled via a capacitor 41 to an amplifier 42. Coupling capacitor 41 eliminates the direct current component from the rectangular wave and the resulting alternating rectangular wave is amplified by amplifier 42 and applied to a first field winding 46 of motor 10. A second field winding 47 of motor 10 is connected directly across the output terminals of source 8, and the armature of motor 10 is mechanically coupled via the coupling 12 to the variable capacitor 13 included in oscillatory circuit 6 as hereinbefore noted in connection with Fig. 1.

Motor 10 may be a two-phase induction motor wherein the application of alternating energy waves of different phase to windings 46 and 47, respectively, causes the armature of motor 10 to rotate. If the wave applied to winding 46 is in lagging phase relationship with respect to the wave applied to winding 47, the armature of motor 10 turns in one direction; and, if the phase of the wave applied to winding 46 leads the wave applied to winding 47, the armature of motor 10 turns in the opposite direction.

The operation of the servo feedback circuit for oscillatory circuit 6 shown in Fig. 2 may be summarized as follows:

(1) When the output frequency of oscillatory circuit 6 at terminals 15*a* and 15*b* is equal to the predetermined cross-over frequency *f* of filters 16 and 18, the interleaved samples derived from the filters by sampling relay 17 are of equal amplitude and the combined energy wave derived therefrom is of zero amplitude so that winding 46 of motor 10 is not energized. This permits motor 10 to remain at standstill.

(2) When the output frequency of oscillatory circuit 6 increases to a frequency which is greater than the predetermined cross-over frequency *f*, the samples in the series derived from high-pass filter 18 are of greater amplitude than the samples in the series derived from low-pass filter 16. The envelope of the interleaved and rectified samples appearing in the output of the low-pass filter 37 comprises a series of spaced positive-going pulses with the pulses which represent the samples from high-pass filter 18 being of greater amplitude than the alternate pulses representing the samples from low-pass filter 16. All of these pulses appear in the input to amplifier 42 as an alternating rectangular wave wherein the positive-going half cycles correspond to the intervals during which the output of highpass filter 18 was sampled and the negative-going half cycles correspond to the intervals during which the output of low-pass filter 16 was sampled. Accordingly, the application of this rectangular energy wave to winding 46 drives the armature of motor 10 in rotation in such a direction as to change the setting of capacitor 13 to reduce the servo feedback output frequency, and the test signal output frequency, of oscillatory circuit 6. As the output frequency is reduced toward the predetermined cross-over frequency *f*, the amplitudes of the outputs of low-pass filter 16 and high-pass filter 18 approach equality and the amplitude of the alternating rectangular wave applied to motor winding 46 approaches zero.

(3) When the output frequency of oscillatory circuit 6 decreases below the predetermined cross-over frequency *f*, a rectangular energy wave is derived in a similar manner. However, in this case the half cycles thereof representing the intervals during which the output of high-pass filter 18 is sampled are negative-going instead of positive-going, and the half cycles representing the intervals during which low-pass filter 16 is sampled are now positive-going. In other words, the polarity of the rectangular wave which is derived from the samples for the condition of the output frequency of oscillatory circuit 6 being less than predetermined cross-over frequency *f* is of opposite polarity to the rectangular wave derived from the filter samples for the condition of the output frequency of oscillatory circuit 6 being greater than predetermined cross-over frequency *f*. Now the application of the alternating rectangular wave of the opposite polarity to motor winding 46 drives the armature of motor 10 in rotation in a direction opposite to that just mentioned. This changes the setting of capacitor 13 to increase the output frequency of oscillatory circuit 6.

As was noted above, the rectangular wave under the conditions of the oscillatory circuit 6 output frequency being either above or below the predetermined frequency *f* differs in phase with respect to the output wave of source 8 by approximately 90 degrees. Thus, when the rectangular wave is changed from one polarity to an opposite polarity, its phase relationship with respect to the output wave of source 8 is switched between a leading and a lagging relationship so that the direction of rotation of the armature of motor 10 is reversed in a like manner.

It will be seen from the above description of Fig. 2 that for signals representing oscillatory circuit mistuning the servo feedback circuit for tuning oscillatory circuit 6 includes a single transmission channel from armature 22 of the sampling relay 17 to variable capacitor 13 in oscillatory circuit 6. Accordingly, the effects of vacuum tube aging, temperature changes, and similar influences on the transmission characteristics of circuit elements in such single transmission channel are substantially the same for signal samples representing increases or decreases in the output frequency of oscillatory circuit 6 relative to the predetermined cross-over frequency *f*.

Figure 3:
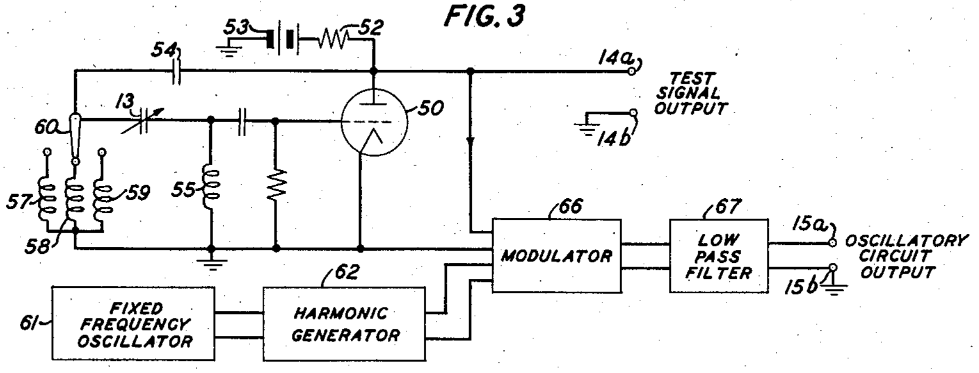
Fig. 3 is a schematic diagram of the circuit represented by the block designated "Oscillatory Circuit" in Fig. 2.

Referring to Fig. 3, there is shown one oscillatory circuit which may be employed as the oscillatory circuit 6 of Fig. 2. The circuit of Fig. 3 provides a test signal output of one frequency and an oscillatory circuit output of a different frequency in a circuit which is similar to that shown in my United States Patent No. 2,508,547, which issued May 23, 1950. In Fig. 3, an oscillator including the vacuum tube triode 50 generates a test signal of approximately the desired output frequency. The oscillator also includes a load resistor 52 and a battery 53 connected in series between the anode of tube 50 and ground, and a feedback connection for coupling oscillations from the anode of tube 50 to the control grid thereof via a coupling capacitor 54 and an adjustable tank circuit. The tank circuit includes a first coil 55, adjustable capacitor 13, and three coils 57, 58, and 59 of different amounts of effective inductance. A single-pole selector switch 60 is provided for connecting one of the coils 57, 58, or 59 in the tank circuit whereby different ranges of oscillator output frequency may be provided. The adjustment of capacitor 13 exercises a fine control of the oscillator circuit output frequency within each of the available ranges. Thus, the frequency of the test signal output may be set in different frequency ranges by switch 60 and adjusted in a limited manner within those ranges by capacitor 13.

A fixed frequency oscillator 61 may be a frequency standard such as that described by W. A. Marrison in "A High Precision Standard of Frequency," Bell System Technical Journal, volume VIII, page 493, 1929. The output of fixed frequency oscillator 61 is coupled to a harmonic generator 62 of the type disclosed in the U.S. Patent No. 2,146,091, issued February 7, 1939, to E. Peterson. The output of oscillator tube 50 and the output of harmonic generator 62 are coupled to separate inputs of a modulator 66 and the output of modulator 66 is applied to a low-pass filter 67. The output of low-pass filter 67 corresponds to the output of oscillatory circuit 6 at terminals **15*a* and 15*b* in Fig. 2. The pass range of low-pass filter 67** is arranged so that it includes the predetermined cross-over frequency *f* mentioned above in connection with the discriminator filters 16 and 18 of Fig. 2 but excludes the fundamental frequency of fixed frequency oscillator 61.

The advantage of the type of overall oscillatory circuit illustrated in Fig. 3 is that the oscillations at the anode of oscillator tube 50 can be locked in at numerous different frequencies corresponding to the various harmonics in the ouputs of harmonic generator 62 by simply adjusting switch 60 and capacitor 13. Switch 60 generally will be adjusted manually while capacitor 13 will be adjusted by an automatic tuning arrangement as hereinbefore described in connection with Fig. 2. Modulator 66 and low-pass filter 67 always extract from the output of oscillator tube 50 the same difference frequency between the test signal output at terminals **14*a* and 14*b* and one of the harmonics in the output of harmonic generator 62 for the purpose of providing a voltage at terminals 15*a* and 15*b* for controlling the setting of capacitor 13 as described above in connection with Fig. 2. The adjustment of capacitor 13 causes the same frequency change in the outputs at terminals 14*a* and 14*b* and 15*a* and 15*b*. The test signal output at terminals 14*a* and 14*b* can be set to a variety of different frequencies corresponding to the variety of frequencies in the output of harmonic generator 62 with approximately the same accuracy as the frequency standard oscillator 61** without the necessity of providing numerous critically designed filters for each of the test signal output frequencies that may be desired.

Figure 4:
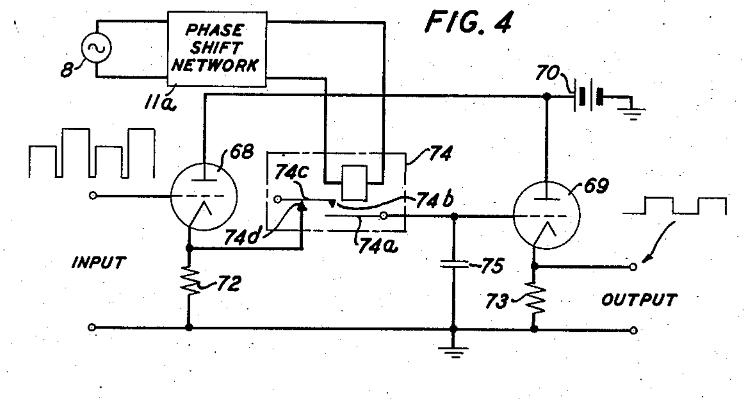
Fig. 4 is a schematic diagram of the circuit represented by the block designated "Switching Transient Eliminator" in Fig. 2.

Referring to Fig. 4, there is shown a schematic circuit diagram of a switching transient eliminator circuit corresponding to the eliminator circuit 40 in Fig. 2. The circuit of Fig. 4 is similar to a transient eliminating circuit disclosed in my United States Patent No. 2,735,904, issued February 21, 1956. In Fig. 4, two triode vacuum tubes 68 and 69 are connected as tandem cathode followers with a common anode supply source 70 and separate cathode load resistors 72 and 73. The cathode of triode 68 is coupled to the control grid of triode 69 via the contacts of a make-before-break relay 74 and a shunt capacitor 75. Relay 74 is energized by the output voltage of source 8 via phase shift network **11*a* which is similar to phase shift network 11 in Fig. 2, except the network 11*a* is designed to shift the output voltage of source 8 approximately 160 degrees so that relay 74 is actuated during the ending portion of each pulse applied to the input of triode 68**.

Spaced positive pulses having waveforms as shown adjacent triode 68 in Fig. 4 are applied to the input of triode 68 between ground and the control grid thereof. Relay 74 connects the cathode of triode 68 to the control grid of triode 69 and to capacitor 75 for a brief interval at the end of each of the positive pulses. Relay 74 is a single-pole-double-throw relay of the make-before-break variety in which armature **74*a* is actuated upwardly to engage contact 74*b* on armature 74*c* before driving the armature 74*c* out of contacting engagement with contact 74*d*. When armature 74*a* is moved downwardly it is followed by armature 74*c* which engages contact 74*d* before armature 74*a* goes out of contacting engagement with contact 74*b*. The connection interval during which the cathode of tube 68 is connected to the control grid of tube 69 corresponds to the interval during the operation of relay 74 when armatures 74*a* and 74*c* are in engagement with contacts 74*b* and 74*d*, respectively, at the same time. During this interval, a positive pulse is applied to the control grid of triode 69 and stored in capacitor 75. The charge on capacitor 75 maintains a positive bias on the control grid of triode 69 between successive connection intervals. Thus the wave envelope in the output of cathode follower triode 69, which appears across cathode resistor 73, is essentially a symmetrical rectangular alternating wave as shown in the waveform adjacent the output of triode 69**, that is, the latter output wave lacks the low potential intervals between pulses which were characteristic of the spaced pulses shown in the waveforms in the input to the circuit of Fig. 4.

Figure 5:
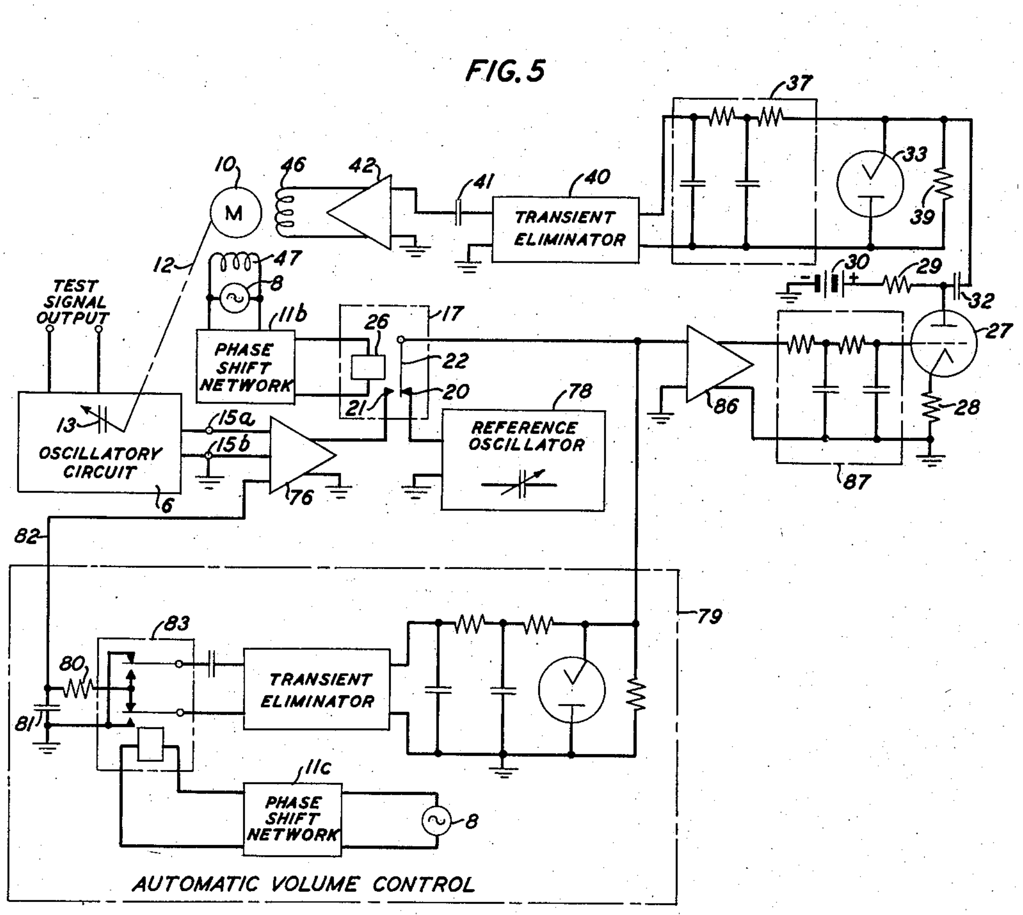
Fig. 5 is a schematic diagram of another embodiment of the invention.

Referring to Fig. 5, there is illustrated another embodiment of the invention wherein a somewhat different means is provided for adjusting the output frequencies of oscillatory circuit 6. Certain portions of this embodiment are the same as those illustrated in Fig. 2 and are designated with like reference characters. In Fig. 5, the output of oscillatory circuit 6 at terminals **15*a* and 15*b* is applied to the input of an amplifier 76 whose output is connected to contact 21 of sampling relay 17. The output of reference frequency oscillator 78 is connected to contact 20 of sampling relay 17, and is adjustable in frequency. Operating coil 26 of relay 17 is energized by the output of source 8 via phase shift network 11*b* to actuate armature 22 into alternate engagements with contacts 21 and 20 to sample the output oscillations of oscillatory circuit 6 and reference oscillator 78**, respectively.

Armature 22 in Fig. 5 is connected to the input of an automatic volume control, AVC, circuit 79 which is similar to the AVC circuit shown in my above-identified Patent No. 2,735,904, and to the input of amplifier 86 to be presently mentioned. The output of AVC circuit 79 is coupled to the input of amplifier 76 to adjust the gain thereof in response to any difference in the amplitudes of the oscillation samples effective at armature 22. It will be understood, of course, that the output amplitudes of amplifier 76 and reference oscillator 78 are initially adjusted to substantial equality with AVC circuit 79 disconnected. Thereafter, during operation, the AVC circuit 79 is connected and it operates in such a manner that the samples from armature 22 are rectified, filtered, and the switching transient eliminated essentially in the manner described above in connection with the operation of diode 33, filter 37, and switching transient eliminator circuit 40 in Fig. 2. As a consequence, the output of the latter circuit includes an alternating rectangular voltage. Referring again to Fig. 5, it will be seen that AVC circuit 79 also includes a reversing relay 83 energized by the output voltage of source 8 via phase shift network 11*c*. Relay 83 serves to reverse the polarity of alternate half cycles of the alternating rectangular wave applied thereto for producing in the output thereof a direct current signal having a magnitude which varies in accordance with the differences between sample amplitudes from oscillatory circuit 6 and reference oscillator 78 as received at armature 22 in Fig. 5. This direct current signal is integrated in a network comprising series resistor 80 and shunt capacitor 81. The phase shift network 11*c* is similar to the networks 11*a* and 11*b* but is designed to shift the output voltage of source 8 in Fig. 5 approximately 80 degrees so that relay 83 is operated at the beginning of each pulse applied thereto from tube 69 of the transient eliminator circuit 40. The integrated potential appearing across capacitor 81 is applied via lead 82 to the input of amplifier 76 for controlling the gain thereof.

Armature 22, as above noted, is also connected to one input terminal of an amplifier 86 whose output is applied to an impedance network 87 which has a substantially linearly varying transmission characteristic in response to frequency changes within a predetermined range. Network 87 may comprise, for example, a low-pass filter having the low frequency portion of its transmission versus frequency characteristic include the range of frequency variations that may be desired for the output of oscillatory circuit 6 at terminals 15*a* and 15*b*. Thus impedance network 87 presents a predetermined attenuation to the desired output frequency $f$ of oscillatory circuit 6, a larger attenuation to higher frequencies and a smaller attenuation to lower frequencies.

The output voltage of impedance network 87 is applied to the input of buffer amplifier 27 whose output is subsequently utilized via diode 33, filter 37, transient eliminator circuit 40, capacitor 41, and amplifier 42 to form an alternating rectangular wave for application to motor winding 46 and thereby tuning oscillatory circuit 6 in the manner previously described in connection with Fig. 2.

In Fig. 5, the sampling relay 17 performs the functions of the sampling device 7 of Fig. 1. The functions of the wave-forming circuit 9 of Fig. 1 are performed by impedance network 87, diode 33, and filter 37 together with reference oscillator 78 and sampling relay 17 in Fig. 5.

The operation of the embodiment of Fig. 5 may be summarized as follows:

(1) The amplitudes of the output samples effective at armature 22 from oscillatory circuit 6 and reference oscillator 78 are equalized by controlling the gain of amplifier 76 in response to signals from the AVC circuit 79 whereby spaced oscillation samples of equal amplitudes are applied via armature 22 to the input of amplifier 86.

(2) When the frequency of the output of oscillatory circuit 6 is equal to the frequency of the output of reference oscillator 78, all oscillation samples effective at armature 22 are equally attenuated by impedance network 87 and, as a consequence, no alternating energy wave is derived from the output of network 87 and therefore no voltage is applied to motor winding 46 for retuning oscillatory circuit 6. Thus, a retuning of oscillatory circuit 6 is not required.

(3) When the frequency of the output of oscillatory circuit 6 increases to a value which is greater than the frequency of the output of reference oscillator 78, the output samples from oscillatory circuit 6 are attenuated by network 87 to a greater extent than the output samples from reference oscillator 78. Accordingly, an alternating rectangular energy wave of a first polarity is derived from the output of network 87 and applied to motor winding 46 for actuating capacitor 13 in such sense as to reduce the frequency of oscillatory circuit 6.

(4) When the output frequency of oscillatory circuit 6 decreases to a value which is less than the frequency of reference oscillator 78, the output samples from oscillatory circuit 6 are attenuated to a lesser degree than those from reference oscillator 78. Accordingly, an alternating rectangular wave of a second polarity is applied to motor winding 46 for actuating capacitor 13 in such sense as to increase the frequency of oscillatory circuit 6. Thus, the amplitude difference between successive oscillation samples in the output of impedance network 87, for increases and decreases in the output frequency of oscillatory circuit 6, is the same as the amplitude difference between successive oscillation samples appearing at armature 22 in the circuit of Fig. 2 as hereinbefore described.

If the frequency of reference oscillator 78 is changed, oscillatory circuit 6 is automatically retuned by the cooperation of sample relay 17, network 87, diode 33, filter 37, and motor 10 in the manner hereinbefore described to cause oscillatory circuit 6 to generate at terminals 15*a* and 15*b* the same frequency as is being generated by reference oscillator 78.

Although this invention has been described with reference to particular embodiments thereof, modifications thereof which will be obvious to those skilled in the art are included within the spirit and scope of this invention as outlined in the following claims.

What is claimed is:

1. An oscillatory circuit tuning means comprising an oscillatory circuit, and feedback means for controlling the frequency thereof comprising a source of alternating potential, tuning means in said oscillatory circuit for adjusting the frequency thereof, an electric motor mechanically coupled for actuating said tuning means in response to mistuning of said oscillatory circuit, a frequency-sensitive network comprising two transmission paths having equal attenuation at only one frequency and having the inputs thereof connected in multiple to the output of said oscillatory circuit, an envelope detector circuit, electric switching means actuated by said source for alternately connecting the outputs of said two transmission paths to the input of said envelope detector circuit, and means for applying the output of said envelope detector circuit to said motor.

2. The oscillatory circuit in accordance with claim 1 wherein one of said transmission paths includes an adjustable resistor connected in series therewith for changing the one frequency at which the attenuation characteristics of said two paths are equal.

3. The oscillatory circuit in accordance with claim 1 wherein said oscillatory circuit comprises a fixed frequency oscillator, a harmonic generator having the input thereof coupled to the output of said fixed frequency oscillator, a variable frequency oscillator having means for adjusting the frequency thereof to correspond approximately to a frequency of the output of said harmonic generator plus said one frequency at which the attenuation characteristics of said two transmission paths are equal, a modulator circuit having one input connected to the output of said harmonic generator and having another input connected to the output of said variable frequency oscillator, a low-pass filter connected to the output of said modulator and having a passing frequency range which includes said one frequency but which does not include the frequency of said fixed frequency oscillator, and means for connecting the output of said low-pass filter to the inputs of said two transmission paths.

4. The oscillatory circuit in accordance with claim 3 wherein one of said transmission paths comprises filter means and an adjustable resistor connected in series therewith for changing the frequency at which the attenuation characteristic of said filter means is equal to the attenuation characteristic of the other transmission path.

5. An oscillatory circuit tuning system comprising an oscillator having means for tuning said circuit to produce oscillations of different frequencies, and feedback means for automatically controlling the frequency of said oscillator, said feedback means comprising a source of alternating potential, an electric motor having first and second field windings and having an armature mechanically coupled to said tuning means, means for applying the output from said source to said first winding, a high-pass filter and a first low-pass filter having the inputs thereof connected in multiple to the output of said oscillator and having equal attenuation at only one predetermined frequency of said oscillator, an electromagnetic relay actuated by said alternating potential source for alternately sampling the outputs of said high-pass and first low-pass filters, respectively, for producing alternate samples of the oscillations in said filter outputs, electric wave rectifier means having a single current conduction path, a buffer amplifier connected in said feedback means for applying the alternate samples of said oscillations from said relay to the input of said rectifier means, a second low-pass filter connected to the output of said rectifier means for passing the frequency of the envelope of said alternate oscillation samples and rejecting the frequency of said oscillations, a first cathode follower circuit having the input thereof connected to the output of said second low-pass filter, a second cathode follower circuit, a make-before-break relay having the contacts thereof connected in series between the output of said first cathode follower and the input of said second cathode follower whereby said cathode followers are connected in tandem during the make-before-break interval during each operation of the last-mentioned relay, a capacitor connected in shunt with the input of said second cathode follower, an alternating wave amplifier, alternating current circuit means for coupling the input of said amplifier to the output of said second cathode follower, and means for applying the output of said amplifier to said second field winding.

6. The oscillatory circuit tuning means in accordance with claim 5 wherein said oscillator circuit comprises a fixed frequency oscillator, a harmonic generator coupled to the output of said fixed frequency oscillator, a variable frequency oscillator having course frequency control means for adjusting the frequency thereof within the range of output frequencies of said harmonic generator and fine frequency adjusting means mechanically coupled to said motor, a modulator having the inputs thereof coupled to the outputs of said variable frequency oscillator and of said harmonic generator, and a third low-pass filter for connecting the output of said modulator to the multiple-connected inputs of said high-pass and first low-pass filters.

7. The oscillatory circuit tuning system in accordance with claim 5 wherein an adjustable resistor is connected in series in one of said multiple-connected filter inputs for adjusting the frequency at which the attenuation characteristics of said multiple-connected high-pass and first low-pass filters are equal.

8. A frequency discriminator circuit for providing an alternating voltage output wave having an amplitude and a phase which are indicative of the amount and the sense, respectively, of an input signal frequency deviation from a predetermined frequency within a limited frequency range, said discriminator circuit comprising a high-pass filter, a first low-pass filter, said filters having attenuation versus frequency characteristics which are equal at only said predetermined frequency, and input circuit including means for applying said input signal to the inputs of said filters in multiple, an electromagnetic relay, means for actuating said relay at a frequency which is substantially lower than said predetermined frequency for alternately sampling said signal in the outputs of said filters, the signal samples derived by said relay from the outputs of said filters, respectively, having different amplitudes in response to said frequency deviation, rectifier means having a single current conduction path, means for applying all of said samples from said relay to said rectifier means, means for extracting the envelope of said samples from the rectified samples in the output of said rectifier, an output circuit, and means for coupling the alternating current component of said sample envelope to said output circuit.

9. The frequency discriminator circuit in accordance with claim 8 in which an adjustable resistor is connected in series in one of said filters for adjusting the frequency at which the attenuation characteristics of said filters are equal thereby changing said predetermined frequency.

10. The frequency discriminator circuit in accordance with claim 8 wherein there is a transient voltage between said signal samples, said extracting means comprises a second low-pass filter having the input thereof connected to the output of said rectifier means, and means for eliminating said transient voltage comprising a first cathode follower having the input thereof connected to the output of said second low-pass filter, a second cathode follower, a make-before-break relay connected between the output of said first cathode follower and the input of said second cathode follower, means for actuating said make-before-break relay in synchronism with said electromagnetic relay to connect said cathode followers in tandem only during a portion of each of said samples, and a capacitor connected in shunt with the input of said second cathode follower.

References Cited in the file of this patent

UNITED STATES PATENTS

| | | |
|---|---|---|
| 2,424,833 | Korman | July 29, 1947 |
| 2,747,095 | Boucke | May 22, 1956 |